United States Patent
Kingery et al.

(10) Patent No.: US 9,800,437 B2
(45) Date of Patent: Oct. 24, 2017

(54) PARALLELIZABLE REDUCED STATE SEQUENCE ESTIMATION VIA BCJR ALGORITHM

(71) Applicant: Northrop Grumman Systems Corporation, Falls Church, VA (US)

(72) Inventors: Robert S. Kingery, Los Angeles, CA (US); Daniel N. Liu, Torrance, CA (US)

(73) Assignee: Northrop Grumman Systems Corporation, Falls Church, VA (US)

(*) Notice: Subject to any disclaimer, the term of this patent is extended or adjusted under 35 U.S.C. 154(b) by 10 days.

(21) Appl. No.: 15/071,491

(22) Filed: Mar. 16, 2016

(65) Prior Publication Data

US 2017/0272283 A1 Sep. 21, 2017

(51) Int. Cl.
*H03M 13/00* (2006.01)
*H04L 25/03* (2006.01)
*H03M 13/27* (2006.01)
*H03M 13/39* (2006.01)
*H03M 13/41* (2006.01)

(52) U.S. Cl.
CPC .. *H04L 25/03229* (2013.01); *H03M 13/2771* (2013.01); *H03M 13/2792* (2013.01); *H03M 13/3944* (2013.01); *H03M 13/3955* (2013.01); *H03M 13/3972* (2013.01); *H03M 13/41* (2013.01); *H04L 25/03019* (2013.01); *H04L 25/03305* (2013.01)

(58) Field of Classification Search
None
See application file for complete search history.

(56) References Cited

U.S. PATENT DOCUMENTS

| 6,658,071 B1 | 12/2003 | Cheng |
| 8,572,470 B2 | 10/2013 | Hu et al. |
| 8,711,988 B2 | 4/2014 | Chen |
| 2007/0127608 A1* | 6/2007 | Scheim ............... H04B 7/0413 375/346 |

(Continued)

OTHER PUBLICATIONS

Zhang, S. et al; Transoceanic Transmission of 40×117.6 Gb/s PDM-OFDM-16QAM Over Hybrid Large-Core/Ultralow-Loss Fiber; Journal of Lightwave Technology; vol. 31, No. 4; pp. 498-505; Feb. 15, 2013.

(Continued)

*Primary Examiner* — M. Mujtaba Chaudry
(74) *Attorney, Agent, or Firm* — Patti & Malvone Law Group, LLC

(57) ABSTRACT

An apparatus and method for optimizing the performance of satellite communication system receivers by using the Soft-Input Soft-Output (SISO) BCJR (Bahl, Cocke, Jelinek and Raviv) algorithm to detect a transmitted information sequence is disclosed. A Sliding Window technique is used with a plurality of reduced state sequence estimation (RSSE) equalizers to execute the BCJR algorithm in parallel. A serial data stream is converted into a plurality of data blocks using a serial-to-parallel converter. After processing in parallel by the equalizers, the output blocks are converted back to a serial data stream by a parallel-to-serial converter. A path history is determined using maximum likelihood (ML) path history calculation.

20 Claims, 2 Drawing Sheets

(56) References Cited

U.S. PATENT DOCUMENTS

| | | | | |
|---|---|---|---|---|
| 2009/0177945 A1* | 7/2009 | Djordjevic | ......... | H03M 13/1102 714/758 |
| 2010/0050048 A1* | 2/2010 | Djordjevic | ......... | H03M 13/1117 714/755 |
| 2012/0207470 A1* | 8/2012 | Djordjevic | ............. | H04B 10/25 398/44 |
| 2016/0112065 A1* | 4/2016 | Chang | ............... | H03M 13/3972 714/776 |

OTHER PUBLICATIONS

Roth, C. et al; Efficient Parallel Turbo-Decoding for High-Throughput Wireless Systems; Circuits and Systems I: Regular Papers, IEEE Transactions on , vol. 61, No. 6, pp. 1824-1835; Jun. 2014.

Lehmann, A.M. et al; Single-antenna interference cancellation for complex-valued signal constellations with applications to GSM/EDGE; Personal Indoor and Mobile Radio Communications (PIMRC), 2011 IEEE 22nd International Symposium on; pp. 1417-1422, Sep. 11-14, 2011.

Yang, X. et al; Iterative row-column-file soft decision feedback equalizer for three-dimensional intersymbol interference channels; Military Communications Conference, 2010—Milcom 2010; pp. 1759-1764; Oct. 31, 2010-Nov. 3, 2010.

* cited by examiner

PARALLELIZABLE REDUCED STATE SEQUENCE ESTIMATION VIA BCJR ALGORITHM

STATEMENT OF GOVERNMENT RIGHTS

The Government of the United States of America has rights in this invention pursuant to Government Contract No. 14-C-0077.

FIELD OF THE INVENTION

The invention relates generally to communications systems and more particularly to satellite communication system receivers that optimize performance by using the Soft-Input Soft-Output (SISO) BCJR (Bahl, Cocke, Jelinek and Raviv) algorithm to recover a transmitted information sequence.

BACKGROUND OF THE INVENTION

Satellite communications experience unique challenges in signal transfer due to distance, imperfections of space electronics and atmospheric conditions. Whether satellites are exchanging signals with a ground device or another space-based device, there is a need to improve the reliability, speed and bandwidth of the communication link.

To increase throughput and efficiency, modern communication systems employ a variety of coding and modulation strategies, as represented in the block diagram of a satellite communication system 100 of FIG. 1. At a transmitter, information bits from bit source 102 are encoded by encoder 104 then interleaved by interleaver 104. Constellation mapper 108 then maps the bits into complex symbols before sending them to SRRC PSF (square root raised cosign pulse shaping filter) 110, digital to analog converter 112 and high power amplifier 114, which sends the symbols over communication channel 116. While traveling through the channel, the symbols in a data stream experience noise and other distortions including intersymbol interference (ISI) where one symbol interferes with neighboring symbols. The source of ISI can be either linear or non-linear.

At a receiver, thermal noise modeled as downlink AWGN (additive white Gaussian noise) 118 is added to the received signal in a summer 120 then sent to RF (radio frequency) Front-End 122. The signal is converted from analog back to digital in A/D 124 then passes through time synchronization block 126 and carrier & clock recovery block 128 as would be understood by one of ordinary skill in the art. The receiver than send the signal through FE-FIR MF (front-end finite impulse response matched filter) 130 before equalizer 132 uses one of several methods, for example, maximum likelihood sequence estimation (MLSE) or reduced sequence state estimation (RSSE), to reduce intersymbol interference to recover the complex symbols before they are de-interleaved in block 134 and decoded in block 136 and sent on to the receiving device, represented as bit sink 140.

An improvement to this system features turbo equalization, which adds a feedback path including interleaver 138 from decoder 136 back to the equalizer 132 of FIG. 1. In order to perform turbo equalization, one must be able to compute the soft-information for each coded bit within each symbol. "Soft information" is a commonly used term in the industry and refers to the Log-Likelihood Ratios (LLRs). LLRs are essentially a statement of how likely a given coded information bit was transmitted given the channel observations and other a priori information. To this end, BCJR is an optimal algorithm to determine a-posteriori probabilities (APPs) of each coded information bit transmitted over an ISI channel given the channel observations. The algorithm operates on a trellis structure in a memory defined by the length of channel memory and modulation order.

Retrieving LLRs from a data signal using the BCJR algorithm requires calculating 4 important metrics. The forward recursion metric, ads), is proportional to the probability of being in state s at time i given the channel observations up to time i. The backward recursion metric, $\beta_i(s)$, is proportional to the probability of the channel observations after time i given being in state s at time i. The transition or branch metric, $\gamma_i(s, s')$, is proportional to the probability of being in state s' at time i and the channel observation at time i, given having been in state s at time i−1. Lastly, the total probability metric, $\sigma_i(s, s')$, is proportional to the probability of transitioning from state s to state s' at time i−1, from which we compute the APP of each coded information bit. The forward and backward metrics and the total probability metrics are calculated using the following recursion equations:

$$\alpha_i(s) = \Sigma_{s' \in S} \alpha_{i-1}(s') \cdot \gamma_i(s', s) \quad [1]$$

$$\beta_i(s) = \Sigma_{s' \in S} \beta_{i+1}(s') \cdot \gamma_{i+1}(s, s') \quad [2]$$

$$\sigma_i(s', s) = \alpha_{i-1}(s') \cdot \gamma_i(s', s) \cdot \beta_i(s) \quad [3]$$

The BCJR algorithm recursively computes these quantities by passing over the trellis from time 0 to time L and computing the forward recursion metrics where L is the length of the trellis, then from time L to time 0 computing the backward recursion metrics, and then finally from time 0 to time L computing the total probability metrics, from which the coded bit-wise APPs are calculated.

From a computational complexity standpoint the BCJR is very intensive because it must store the structure of a large trellis, or data structure, in memory including various metrics for each state and transition in the trellis, and must traverse the trellis 3 times in order to calculate the end result. The trellis data structure is generally represented as a grid of states, with columns representing time and rows representing the complexity of the system (or vice versa), i.e. the length of ISI channel memory and the modulation order. The channel memory is a result of the interference between neighboring symbols as they are being communicated through the channel.

In addition to being computationally intensive, the BCJR algorithm is time intensive because it can't begin executing until the entire data structure is populated.

In the case of intersymbol interference (ISI) communication channels the number of states in the trellis grows exponentially with the length of channel memory and modulation order. This in turn causes the complexity of the MLSE BCJR algorithm quickly to become intractable for many practical applications.

There have been efforts to improve MLSE BCJR from both a computational complexity and memory complexity standpoint. A modification to the MLSE BCJR algorithm is known as the sliding window BCJR (SW-BCJR).

The SW-BCJR algorithm allows for use of parallelization for the classic MLSE BCJR in a pipelined environment, in other words, with a continuous data stream. The windows in SW-BCJR allow execution of the algorithm to occur on a continuous basis, i.e. before the entire data structure is populated. There are two functioning parameters: the window size, w, and the overlap region, l. The trellis is divided into windows of length w time epochs such that each window has a "forward overlap region" of l time epochs, followed by w−2l time epochs, followed by a "backward overlap region" of l time epochs. Consecutive windows overlap one another for 2l epochs so that the forward overlap region of one window shares no common time epochs with the backward overlap region of its neighbor. Thus there are $$\left\lceil \frac{L}{w-2l} \right\rceil$$

windows, and each standard window contains w−2l distinct (non-overlapping) time epochs. The two non-standard windows are the first, which contains w−l distinct epochs, and the last window, which contains (L mod w−2l)−l distinct epochs.

For a given window the forward recursion metrics, α, and the backward recursion metrics, β, are initialized uniformly. The standard MLSE BCJR algorithm is carried out on each window independently under these conditions. Due to the uniform initialization, the execution of the MLSE BCJR algorithm in each window is independent of its execution in every other window. This uniform initialization creates a sub-optimality of the MLSE BCJR algorithm, however, the forward and backward recursion metrics converge to the values produced by the full MLSE BCJR (e.g. being memory and time intensive) within a small enough error that the overall bit error rate (BER) performance is unaffected. The final total probabilities are computed only on the distinct time epochs of each window, throwing out the unconverged metrics of the overlap regions. The parameter l is chosen to be large enough such that this convergence is tight enough as to not affect the final performance.

While providing reduced memory requirements and the opportunity for faster operation, the SW-BCJR, which based on MLSE trellis construction, does not degrade BER performance in uncoded or coded communications regimes. For large enough window size and overlap region, the degradation in performance is negligible. Typically, the BER between the SW-BCJR and the full BCJR is 0 (within numerical precision) for an overlap region of 10 and window size of 100 in QPSK, 8PSK, 16APSK and 32APSK modulations.

Another improvement to the classic MLSE BCJR algorithm is the reduced state sequence estimation (RSSE) for ISI channels which provides a method for reducing the number of states needed in the trellis description. This in turn reduces the complexity of any algorithms which run on the trellis.

For example, for a channel with memory length K, the full-complexity trellis for MLSE has $M^K$ states, where each state at time n corresponds to the K most recent symbols transmitted, $[x_{n-1}, x_{n-2}, \ldots, x_{n-K}]$. In RSSE, the symbol constellation set is partitioned K times, such that each partitioning, $\Omega_i$, has $J_i$ subsets. This partitioning requires that $J_1 \geq J_2 \geq \ldots \geq J_K$ and $\Omega_i$ is a further partitioning of $\Omega_{i+1}$. If these two conditions are met then there is a subset state at time n which depends on the subsets of the K most recent symbols, $[a_{n-1}(1), a_{n-2}(2), \ldots, a_{n-K}(K)]$. These subset states determine a proper trellis. Because each $a_{n-1}$ must be a subset from $\Omega_i$ (which has order $J_i$) there are $J_1 \cdot J_2 \ldots J_K$ states in this new reduced trellis. This can be a dramatic reduction of number of states in the complexity of the trellis.

Trellis based decoding algorithms, such as the Viterbi algorithm or BCJR, are implemented by recursively traversing the trellis and making decisions and calculations about each transition based on previous calculations. On a reduced trellis, such as one resulting from RSSE, the same decisions cannot be made due to the parallel transitions. Thus, to implement BCJR on a reduced trellis, the system must maintain a path history of the last K symbols preceding each state. This is because, in the case of RSSE BCJR, calculation of forward metrics at time n, $\alpha_n(i)$ takes the path history of each state into account when calculating the branch metrics, and calculates a branch metric for each symbol in the parallel transition.

Thus, a need exists for an improved satellite communications system using an algorithm that combines parallelism with a reduced state that requires path history. In other words, a data transfer processing technique that is both being memory efficient (e.g. RSSE BCJR uses reduced number of states in trellis construction) and time efficient (e.g. ability to parallel processing each independent SW within reduced state trellis).

SUMMARY

In an embodiment, the invention combines the memory and parallelization benefits of a SW-BCJR algorithm and the complexity reduction of a reduced state sequence estimation (RSSE) trellis description with path history computation.

The invention in one implementation encompasses a turbo equalizer, including a serial-to-parallel (S/P) converter for receiving a serial data stream comprising a plurality of channel observation samples and converting the data stream to a plurality of parallel data blocks, each comprising one or more samples; a plurality of reduced state sequence estimation (RSSE) Bahl-Cocke-Jelinek-Raviv (BCJR) equalizers, each operatively coupled to the S/P converter to receive a data window further comprising a data block, and to generate an output block comprising Log-Likelihood Ratios (LLRs) for each coded information bit in the data block; and a parallel-to-serial (P/S) converter for receiving the output blocks and converting them to a serial data stream.

In a further embodiment, the invention encompasses a receiver, including a filter configured to filter a received input signal comprising a serial data stream; a serial-to-parallel (S/P) converter for receiving the serial data stream, said serial data stream further comprising a plurality of channel observation samples, and converting the data stream to a plurality of parallel data blocks, each comprising one or more channel observation samples; a plurality of RSSE BCJR equalizers, each operatively coupled to the S/P converter to receive a data window further comprising a data block, and a generate an output block comprising LLRs for each coded information bit in the data block; and a parallel-to-serial (P/S) converter for receiving the output blocks and converting them to a serial data stream.

In either of the above embodiments, the plurality of RSSE BCJR equalizers operate in parallel.

In yet another embodiment, each data window further comprises at least one of forward and backward overlap regions of data adjacent to the data block.

In a further embodiment, each forward overlap region further comprises a region used for a maximum likelihood (ML) path history calculation.

In any of the above embodiments, the data stream is divided into N data blocks, and a data window associated with the first of the N data blocks does not include a forward overlap region and a data window associated with the data block N does not include a backward overlap region.

Another implementation of the invention encompasses a method for performing turbo equalization in a satellite communication system receiver, including the steps of dividing a received serial data stream comprising a plurality of channel observation samples into a plurality of data blocks, each comprising one or more channel observation samples; transferring said plurality of data blocks, each contained within a data window, to a different educed state sequence estimation (RSSE) Bahl-Cocke-Jelinek-Raviv (BCJR) equalizer; processing each data window in a RSSE BCJR equalizer to generate an output block comprising Log-Likelihood Ratios (LLRs) for each coded information bit in the data block; and combining the output blocks and converting them into a serial data stream.

In a further embodiment, each data window further includes at least one of forward and backward overlap regions of data adjacent to the data block.

In another embodiment, each forward overlap region further comprises a region used for a maximum likelihood (ML) path history calculation.

In any of the above embodiments, the forward overlap includes a plurality of states and wherein the ML path history calculation further includes the steps of for each state in the plurality of states, enumerate every possible symbol sequence of length K that would result in that state; calculate an estimated channel output for each sequence at time n and for state s; determine the ML input symbol sequence for each state s using minimum distance decisions; and select the state s having the smallest distance.

In any of the above embodiments, the data stream is divided into N data blocks, and a data window associated with the first of the N data blocks does not include a forward overlap region and a data window associated with the data block N does not include a backward overlap region.

In a further embodiment, the dividing step is performed by a serial-to-parallel converter and the combining step is performed by a parallel-to-serial converter.

DESCRIPTION OF THE DRAWINGS

Features of example implementations of the invention will become apparent from the description, the claims, and the accompanying drawings in which:

DETAILED DESCRIPTION

In an embodiment, the invention combines the memory and independent processing benefits of a SW-BCJR algorithm and the complexity reduction of a reduced state sequence estimation (RSSE) trellis description with path history computation to improve data transmission in a satellite communications system. In particular, the invention encompasses a method of combining these two algorithms, and the result is an algorithm that allows for flexible implementation of a high performing sub-optimal RSSE BCJR algorithm.

The SW-BCJR allows for the computation to be split into windows which may be processed independently. The reduced state sequence estimation (RSSE) trellis description uses a set partitioning scheme to reduce states of the trellis to one with fewer states and with parallel branch transitions.

As a result of these parallel branch transitions, the RSSE algorithm relies on a path history in order to calculate the likelihood of given coded information bit at a given time epoch. In order to take advantage of the potential of the SW-BCJR algorithm, each window starts without any such information of previous decisions. Thus, the invention features a process by which to determine the path history at the beginning of each window independently.

Figure 1:
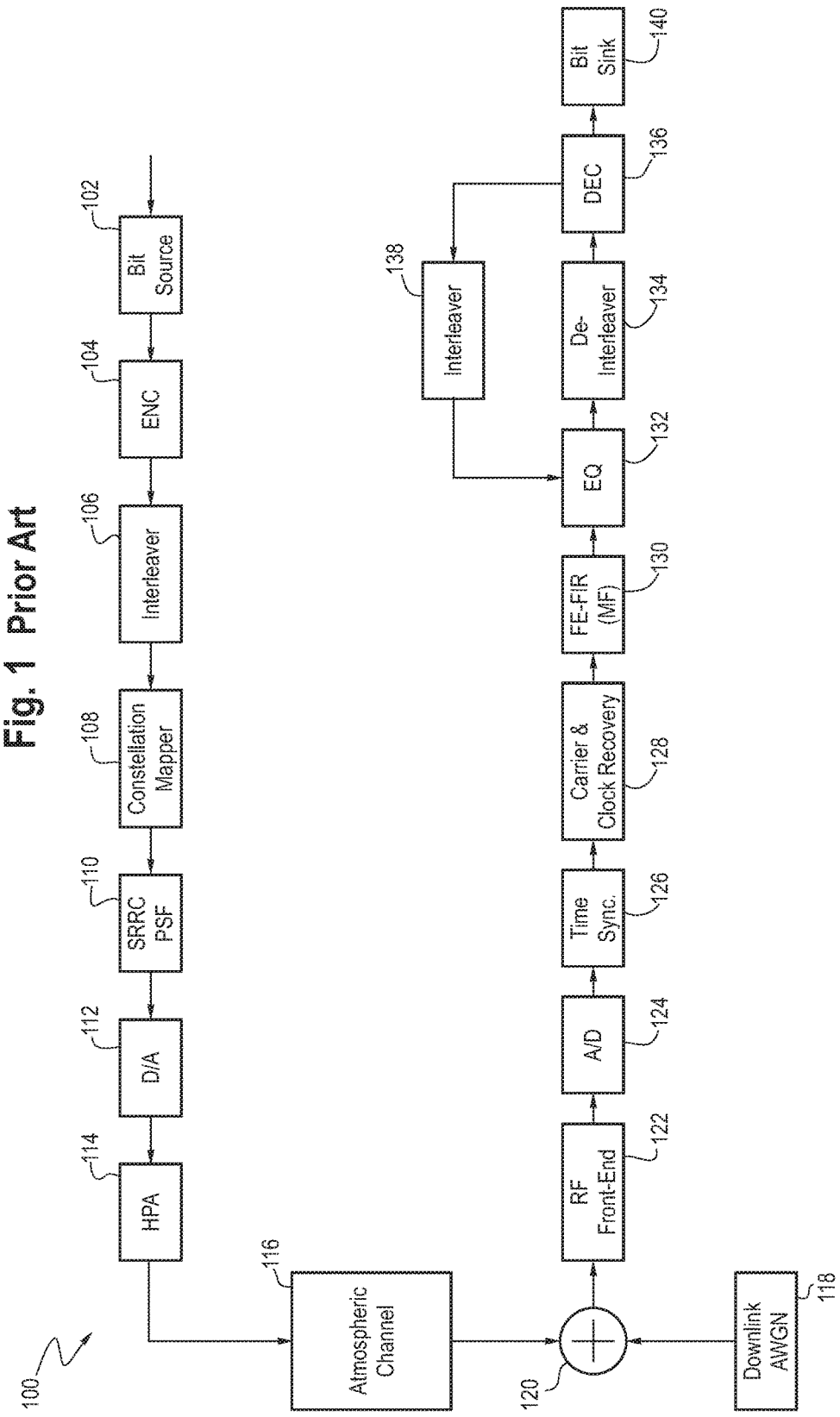
FIG. 1 is a block diagram of a satellite communications system.
Figure 2:
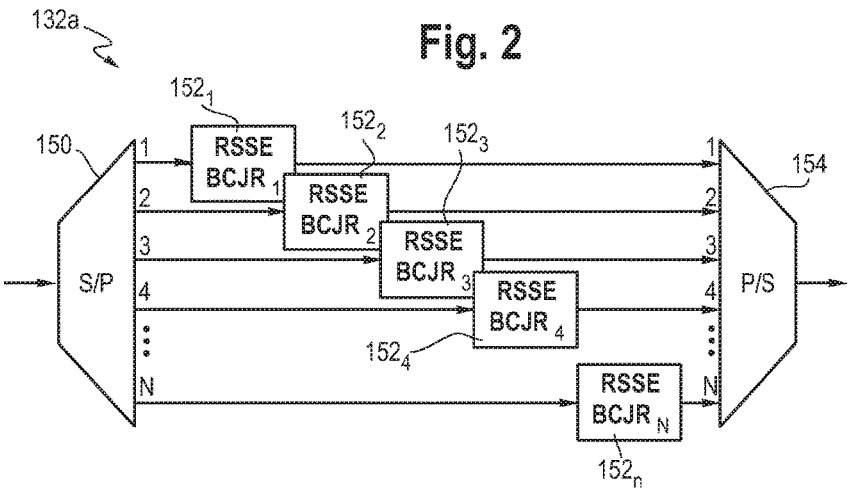
FIG. 2 is a block diagram of an improved equalizer for use in the system of FIG. 1.

As described above, a representative satellite communication system including a transmitter and a receiver is shown in FIG. 1. In an embodiment, the invention encompasses an improved equalizer 132a, shown in more detail in FIG. 2. S/P 150 (serial-to-parallel converter) receives a stream of channel observations or sufficient statistics, for example, from FE-FIR MF 130 of FIG. 1, and converts it to windows of data as described further in connection with FIG. 3. Each window is sent to a different RSSE $BCJR_n$ $152_n$. Each RSSE $BCJR_n$ $152_n$ then operates independently to process the received window. Outputs from the plurality of RSSE $BCJR_n$ $152_n$ are then received by P/S 154 (parallel-to-serial converter), converted back to a serial stream and sent on to de-interleaver 134 of FIG. 1.

Figure 3:
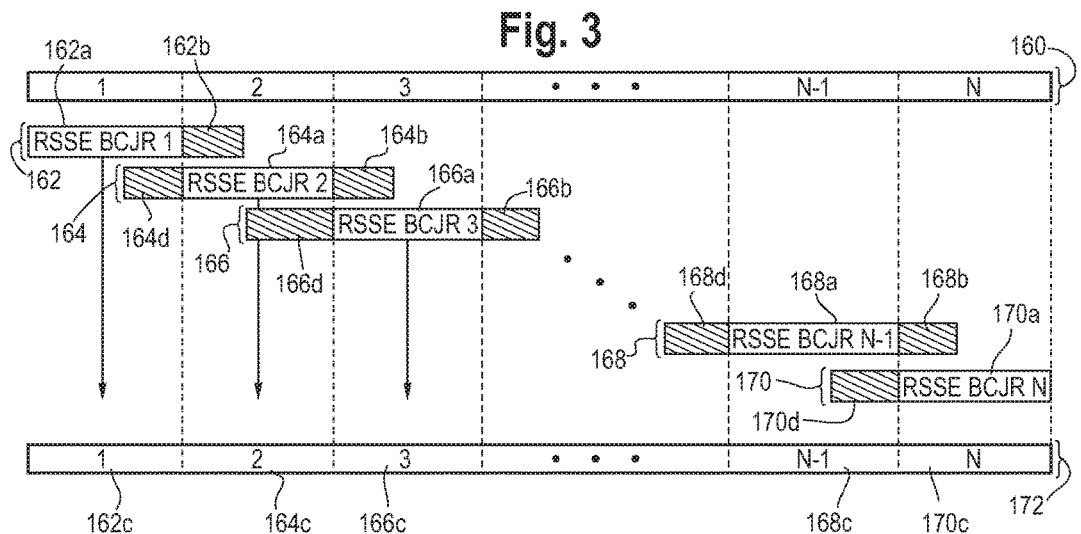
FIG. 3 is a representation of the combined processing of the SW and RSSE BCJR algorithms.

FIG. 3 illustrates the combined processing of the SW BCJR and RSSE algorithms according to the invention. Serial data stream 160 is divided into N data blocks by S/P 150 of FIG. 2. RSSE $BCJR_1$ $152_1$ receives window 162 which includes input data block 1 at 162a and as well as backward overlap data 162b. Overlap regions are required for accurate computation of the RSSE algorithm. RSSE $BCJR_1$ $152_1$ processes window 162 and generates $LLR_1$ 162c (log-likelihood ratio) to the output data stream 172.

In a similar way, RSSE $BCJR_2$ $152_2$ receives window 164 of input data stream 160. Window 164 includes input data block 2 at 164a and backward overlap region 164b as well as forward overlap region 164d. RSSE $BCJR_2$ $152_2$ processes window 164 and generates $LLR_2$ 164c to the output data stream 172.

Likewise, RSSE $BCJR_3$ $152_3$ receives window 166 of input data stream 160. Window 166 includes input data block 3 at 166a and backward overlap region 166b as well as forward overlap region 166d. RSSE $BCJR_3$ $152_3$ processes window 166 and generates $LLR_3$ 166c to the output data stream 172.

The remaining RSSE $BCJR_n$ $152_n$ receive subsequent windows including data blocks 4 through N-1 of input data stream 160 and process them in parallel as shown. As shown in FIG. 3, RSSE $BCJR_{N-1}$ $152_{N-1}$ receives window 168 of input data stream 160. Window 168 includes input data block N-1 at 168a and backward overlap region 168b as well as forward overlap region 168d. RSSE $BCJR_{N-1}$ $152_{N-1}$ processes window 168 and generates $LLR_3$ 168c to the output data stream 172.

Finally, RSSE $BCJR_N$ receives input block 170 which includes input data block N at 170a but only forward overlap data 170d to generate output block 170c to output data stream 172. As shown in FIG. 3, all RSSE BCJRs require forward and backward overlap regions, with the exceptions of RSSE $BCJR_1$ and RSSE $BCJR_N$.

Figure 4:
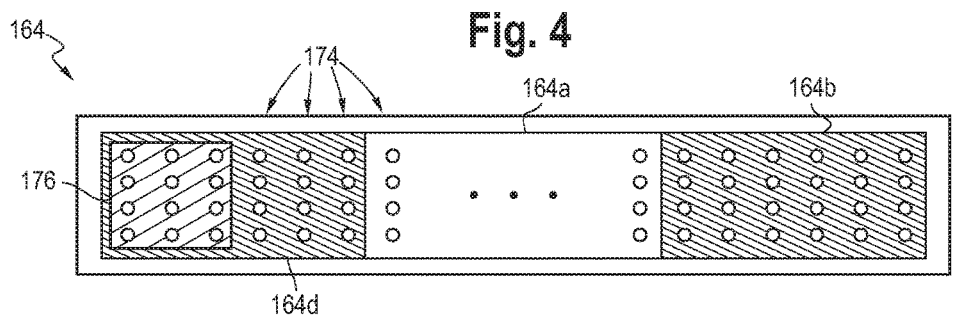
FIG. 4 is a representation of a trellis memory for use with the present invention.

A representation of an individual window in a trellis memory structure of, for example, window 164 of FIG. 3, is shown in FIG. 4. Each column 174 in FIG. 4 represents the possible states that the system can be in at a given time. A state is defined by the last few symbols transmitted, in accordance with the inter-symbol interference channel structure, the set partitioning scheme and the underlying constellation. In the case of the RSSE algorithm, the states are defined by groups of symbols at a moment in time. As described above for FIG. 3, input data block 164a represents the data being processed by RSSE BCJR$_2$ 152$_2$ of FIG. 2, while forward overlap region 164b and backward overlap region 164d include additional data that provides path history information for the RSSE algorithm as explained in more detail below. In particular, block 176 indicates data used for a ML (maximum likelihood) path history calculation.

The method of providing a history of length K−1 before the first time epoch in a window includes several steps. For each state in each of these time epochs the method enumerates every possible symbol sequence of length K that would result in that state. Next, the i$^{th}$ such sequence at time n and for state s is denoted by $p_{n,s}(i)$. (For each $p_{n,s}(i)$, the next step is to calculate the resulting channel output, $\tilde{y}_{n,s}(i)$, using the underlying ISI channel structure (in case of linear channel) or Volterra series model (in case of nonlinear channel).

Using these estimated channel outputs, $\tilde{y}_{n,s}(i)$, the next step involves determining the maximum likelihood input symbol sequence for each state using minimum distance decisions, $$i_s^* = \underset{i}{\mathrm{argmin}} |\tilde{y}_{n,s}(i) - y_n| \qquad [4]$$

Once this step is completed, resulting in the ML symbol sequence for each trellis state, $p_{n,s}(i^*)$, the last step is to compare the minimum distances for each state. From this comparison, the smallest distance is chosen which determines which subset was the last transmitted according to equation [5]:

$$s^* = \underset{s}{\mathrm{argmin}} |\tilde{y}_{n,s}(i_s^*) - y_n| \qquad [5]$$

The last symbol in the sequence $p_{n,s^*}(i^*)$ determines which subset was the most-likely last subset and thus assigns the values for the path history at time n. In an embodiment, the calculated path history is often not identical to the path history of the full BCJR. However, it converges quickly in much the same way as the forward metrics such that be the end of the forward overlap region the path history is perfectly accurate.

The inventive apparatus in one example comprises a plurality of components such as one or more of electronic components, hardware components, and computer software components. A number of such components can be combined or divided in the apparatus. An example component of the apparatus employs and/or comprises a set and/or series of computer instructions written in or implemented with any of a number of programming languages, as will be appreciated by those skilled in the art.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A turbo equalizer, comprising:
   a serial-to-parallel (S/P) converter for receiving a serial data stream comprising a plurality of channel observation samples and converting the data stream to a plurality of parallel data blocks, each comprising one or more samples;
   a plurality of reduced state sequence estimation (RSSE) Bahl-Cocke-Jelinek-Raviv (BCJR) equalizers, each operatively coupled to the S/P converter to receive a data window further comprising a respective data block of the plurality of parallel data blocks and overlap data from at least one adjacent data block, and to generate an output block comprising Log-Likelihood Ratios (LLRs) for each coded information bit in the respective data block; and
   a parallel-to-serial (P/S) converter for receiving the output blocks and converting them to a serial data stream.

2. The turbo equalizer of claim 1, wherein the plurality of RSSE BCJR equalizers operate in parallel.

3. The turbo equalizer of claim 1, wherein the overlap data further comprises at least one of forward and backward overlap regions of the data blocks adjacent to the respective data block.

4. The turbo equalizer of claim 3, wherein each forward overlap region further comprises a region used for a maximum likelihood (ML) path history calculation.

5. The turbo equalizer of claim 3, wherein the data stream is divided into N data blocks, and a data window associated with the first of the N data blocks does not include a forward overlap region.

6. The turbo equalizer of claim 3, wherein the data stream is divided into N data blocks and a data window associated with the data block N does not include a backward overlap region.

7. A receiver, comprising:
   a filter configured to filter a received input signal comprising a serial data stream;
   a serial-to-parallel (S/P) converter for receiving the serial data stream, said serial data stream further comprising a plurality of channel observation samples, and converting the data stream to a plurality of parallel data blocks, each comprising one or more channel observation samples;
   a plurality of reduced state sequence estimation (RSSE) Bahl-Cocke-Jelinek-Raviv (BCJR) equalizers, each operatively coupled to the S/P converter to receive a data window further comprising a respective data block of the plurality of parallel data blocks and overlap data from at least one adjacent data block, and a generate an output block comprising Log-Likelihood Ratios (LLRs) for each coded information bit in the respective data block; and
   a parallel-to-serial (P/S) converter for receiving the output blocks and converting them to a serial data stream.

8. The receiver of claim 7, wherein the plurality of RSSE BCJR equalizers operate in parallel.

9. The receiver of claim 7, wherein the overlap data further comprises at least one of forward and backward overlap regions of the data blocks adjacent to the respective data block.

10. The receiver of claim 9, wherein each forward overlap region further comprises a region used for a maximum likelihood (ML) path history calculation.

11. The receiver of claim 9, wherein the data stream is divided into N data blocks, and a data window associated with the first of the N data blocks does not include a forward overlap region.

12. The receiver of claim 9, wherein the data stream is divided into N data blocks and a data window associated with the data block N does not include a backward overlap region.

13. A method for performing turbo equalization in a satellite communication system receiver, comprising the steps of:
dividing a received serial data stream comprising a plurality of channel observation samples into a plurality of parallel data blocks, each comprising one or more channel observation samples;
transferring said plurality of parallel data blocks, each contained within a data window further comprising overlap data from at least one adjacent data block, to a different reduced state sequence estimation (RSSE) Bahl-Cocke-Jelinek-Raviv (BCJR) equalizer;
processing each data window in it's respective RSSE BCJR equalizer to generate an output block comprising Log-Likelihood Ratios (LLRs) for each coded information bit in the respective data block; and
combining the output blocks and converting them into a serial data stream.

14. The method of claim 13, the overlap data further comprises at least one of forward and backward overlap regions of the data blocks adjacent to the data block.

15. The method of claim 14, wherein each forward overlap region further comprises a region used for a maximum likelihood (ML) path history calculation.

16. The method of claim 14, wherein the forward overlap region includes a plurality of states and wherein the ML path history calculation further comprises the steps of:
for each state in the plurality of states, enumerate every possible symbol sequence of length K that would result in that state;
calculate an estimated channel output for each sequence at time n and for state s;
determine the ML input symbol sequence for each state s using minimum distance decisions; and
select the state s having the smallest distance.

17. The method of claim 14, wherein the data stream is divided into N data blocks, and a data window associated with the first of the N data blocks does not include a forward overlap region.

18. The method of claim 14, wherein the data stream is divided into N data blocks and a data window associated with the data block N does not include a backward overlap region.

19. The method of claim 13 wherein the dividing step is performed by a serial-to-parallel converter.

20. The method of claim 13 wherein the combining step is performed by a parallel-to-serial converter.

* * * * *